(12) United States Patent
Chen et al.

(10) Patent No.: US 9,087,864 B2
(45) Date of Patent: Jul. 21, 2015

(54) MULTIPURPOSE COMBINATORIAL VAPOR PHASE DEPOSITION CHAMBER

(71) Applicant: Intermolecular, Inc., San Jose, CA (US)

(72) Inventors: Chen-An Chen, San Jose, CA (US);
Tony P. Chiang, Campbell, CA (US);
Frank Greer, Pasadena, CA (US);
Martin Romero, San Jose, CA (US);
James Tsung, Milpitas, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/135,307

(22) Filed: Dec. 19, 2013

(65) Prior Publication Data

US 2015/0179487 A1    Jun. 25, 2015

(51) Int. Cl.
*H01L 21/31* (2006.01)
*H01L 21/469* (2006.01)
*H01L 21/677* (2006.01)
*H01L 21/02* (2006.01)

(52) U.S. Cl.
CPC ...... *H01L 21/67703* (2013.01); *H01L 21/0228* (2013.01); *H01L 21/02271* (2013.01); *H01L 21/02274* (2013.01)

(58) Field of Classification Search
USPC .................................................... 438/17, 761
See application file for complete search history.

(56) References Cited

U.S. PATENT DOCUMENTS

| 6,821,910 | B2 | 11/2004 | Adomaitis et al. |
| 7,544,574 | B2 | 6/2009 | Chiang et al. |
| 7,902,063 | B2 | 3/2011 | Chiang et al. |
| 8,334,015 | B2 | 12/2012 | Chiang et al. |
| 2001/0046768 | A1* | 11/2001 | Mezey, Sr. ............... 438/680 |
| 2003/0194493 | A1* | 10/2003 | Chang et al. ............ 427/248.1 |
| 2009/0061108 | A1 | 3/2009 | Endo et al. |
| 2009/0275210 | A1* | 11/2009 | Shanker et al. .......... 438/761 |
| 2010/0167551 | A1 | 7/2010 | DeDontney |
| 2012/0289057 | A1 | 11/2012 | DeDontney |
| 2012/0315396 | A1 | 12/2012 | Endo et al. |
| 2012/0321786 | A1 | 12/2012 | Satitpunwaycha et al. |
| 2013/0130481 | A1 | 5/2013 | Chua et al. |
| 2013/0136862 | A1 | 5/2013 | Satitpunwaycha |
| 2013/0171350 | A1 | 7/2013 | Kraus et al. |

* cited by examiner

*Primary Examiner* — Karen Kusumakar

(57) ABSTRACT

In some embodiments, apparatus are provided that provide for flexible processing in high productivity combinatorial (HPC) system. The apparatus allow for interchangeable functionality that includes deposition, plasma treatment, ion beam treatment, in-situ annealing, and in-situ metrology. The apparatus are designed so that the functionality may be integrated within a single processing chamber for enhanced flexibility.

18 Claims, 13 Drawing Sheets

| Step #1 | Step #2 | Step #"N" |
|---|---|---|
| ALD-Deposition | ALD-Precursor | ALD-Precursor |
| PEALD-Deposition | PEALD-Precursor | PEALD-Precursor |
| CVD-Deposition | CVD-Deposition | CVD-Deposition |
| PECVD-Deposition | PECVD-Deposition | PECVD-Deposition |
| Plasma Treatment | Plasma Treatment | Plasma Treatment |
| In-situ Anneal | In-situ Anneal | In-situ Anneal |
| In-situ Metrology | In-situ Metrology | In-situ Metrology |

FIG. 13

MULTIPURPOSE COMBINATORIAL VAPOR PHASE DEPOSITION CHAMBER

TECHNICAL FIELD

The present disclosure relates generally to thin film deposition and in particular to atomic layer deposition, chemical vapor deposition, and plasma treatment in a deposition chamber configured for combinatorial processing.

BACKGROUND

The manufacture of semiconductor devices, TFPV modules, optoelectronic devices, etc. entails the integration and sequencing of many unit processing steps. As an example, device manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, the CVD and ALD adaptations of HPC techniques generally deposit materials on relatively large areas of the substrate. As an example, ALD deposition on a quarter of the substrate is common. However, it is desirable to deposit materials on a substrate using CVD or ALD in a site isolated manner wherein the size of the region is very small relative to the substrate. Therefore, there is a need to develop methods that enable the deposition of materials using CVD, PECVD, ALD, or PEALD on small segments in a site isolated, combinatorial manner to form multilayer film stacks.

Further developments and improvements, particularly innovations that enable flexibility and increased throughput, and provide combinatorial processing, in thin film deposition are needed.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, apparatus are provided that provide for flexible processing in high productivity combinatorial (HPC) system. The apparatus allow for interchangeable functionality that includes deposition, plasma treatment, ion beam treatment, in-situ annealing, and in-situ metrology. The apparatus are designed so that the functionality may be integrated within a single processing chamber for enhanced flexibility.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

FIG. 13 illustrates an exemplary table for options during the processing of a substrate according to some embodiments.

DETAILED DESCRIPTION

Figure 1:
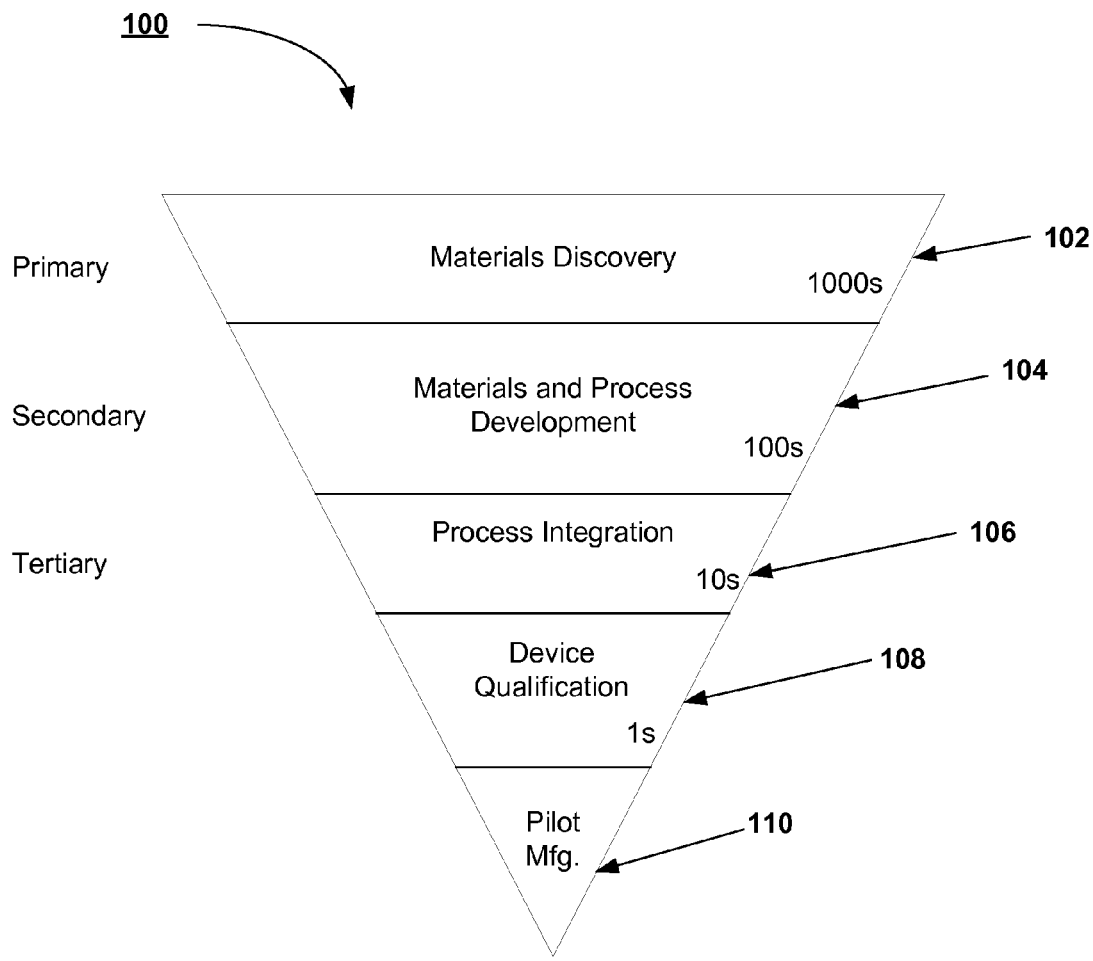
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed.

Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" or "substantially the same" is used, the two quantities may vary from each other by no more than 5%.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

As used herein, the phrases "site-isolated region" (SIR) and "isolated region" will be understood to refer to one or more regions on a substrate that are separated and used for the evaluation of different materials or process parameters. The SIRs can be formed using many different methods such as scribing, deposition through a shadow mask, deposition using isolated deposition heads, lithography, and the like. The present disclosure is not limited by the method used to form the SIRs.

As used herein, the phrase "substrate" will be understood to refer to any conventional round 200 mm, 300 mm, 450 mm, or any other larger or smaller substrate/wafer size. In some embodiments, "substrate" may refer to a square, rectangular, or other shaped substrate. One skilled in the art will appreciate that the "substrate" may be a blanket substrate, a coupon (e.g., partial wafer), or even a patterned substrate having predefined regions.

As used herein, the phrase "process segment" will be understood to describe a sector (e.g. of a generally circular shape) of a deposition apparatus (e.g. a showerhead or a process chamber lid) that may have any one of a number of processing functionalities. Examples of suitable processing functionalities include ALD, CVD, plasma treatment, ion beam treatment, in-situ anneal, and in-situ metrology. Substrates may be placed beneath the deposition apparatus and the process segments will result in a process being performed on an isolated region of the substrate.

The manufacture of devices (e.g. semiconductor, solar, optoelectronic, etc.) entails the integration and sequencing of many unit processing steps. As an example, device manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As discussed previously, part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as semiconductor devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence (s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009, the entireties of which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005, the entireties of which are all herein incorporated by reference.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

Figure 2:
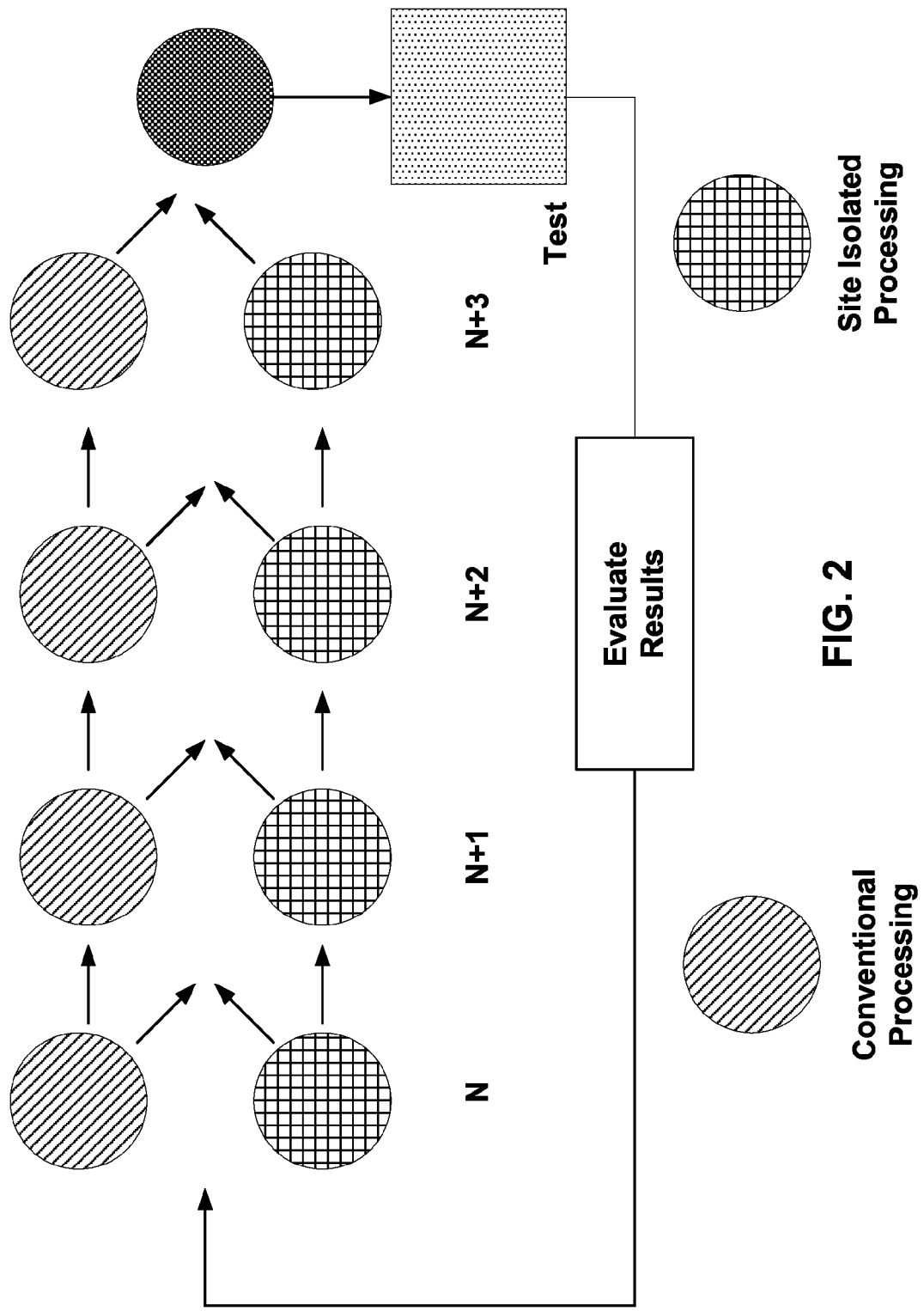
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It will be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It will be appreciated that these process parameters are exemplary and not meant to be an exhaustive list as other process parameters commonly used in semiconductor manufacturing may be varied.

Figure 3:
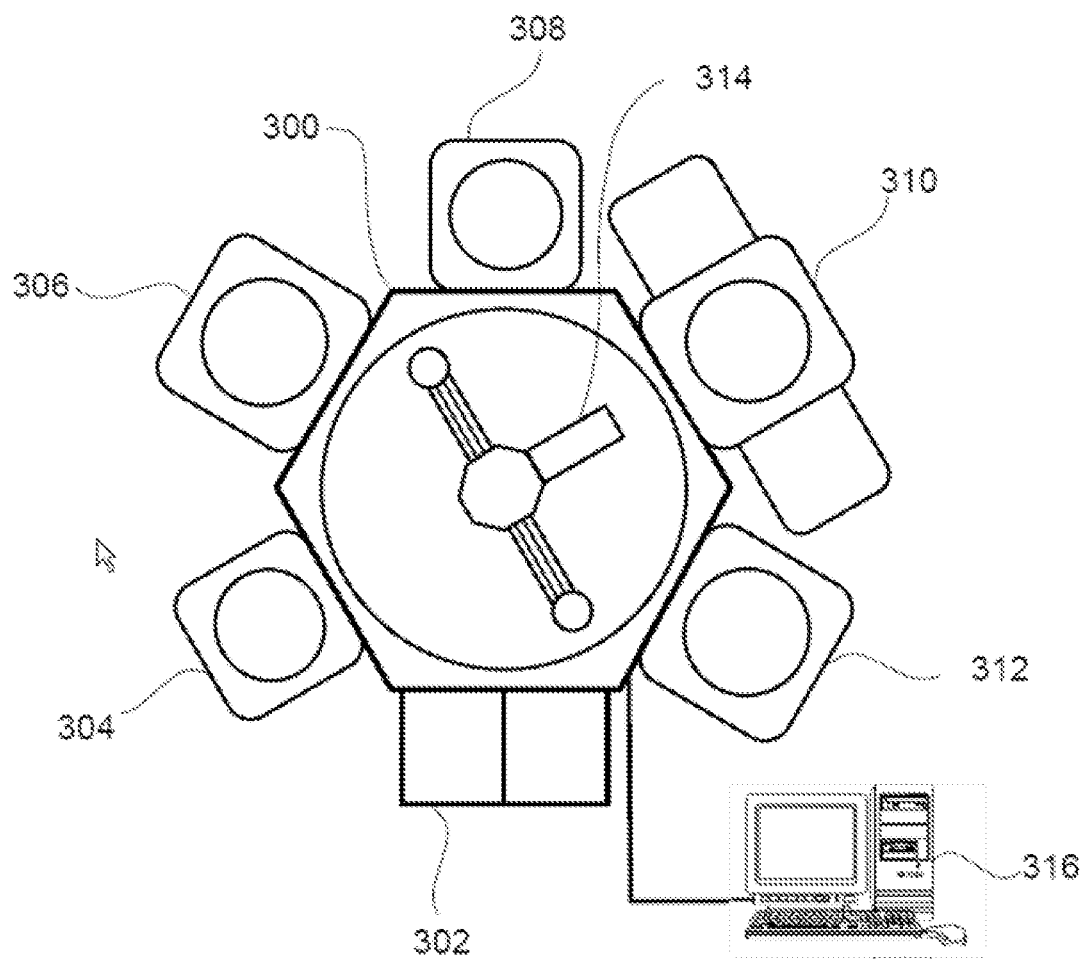
FIG. 3 is a simplified schematic diagram illustrating an integrated high productivity combinatorial (HPC) system.

FIG. 3 is a simplified schematic diagram illustrating an integrated high productivity combinatorial (HPC) system in accordance with some embodiments of the invention. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. application Ser. Nos. 11/672,478 and 11/672,473, the entire disclosures of which are herein incorporated by reference. In a HPC system, a plurality of methods may be employed to deposit material upon a substrate employing combinatorial processes.

Figure 4:
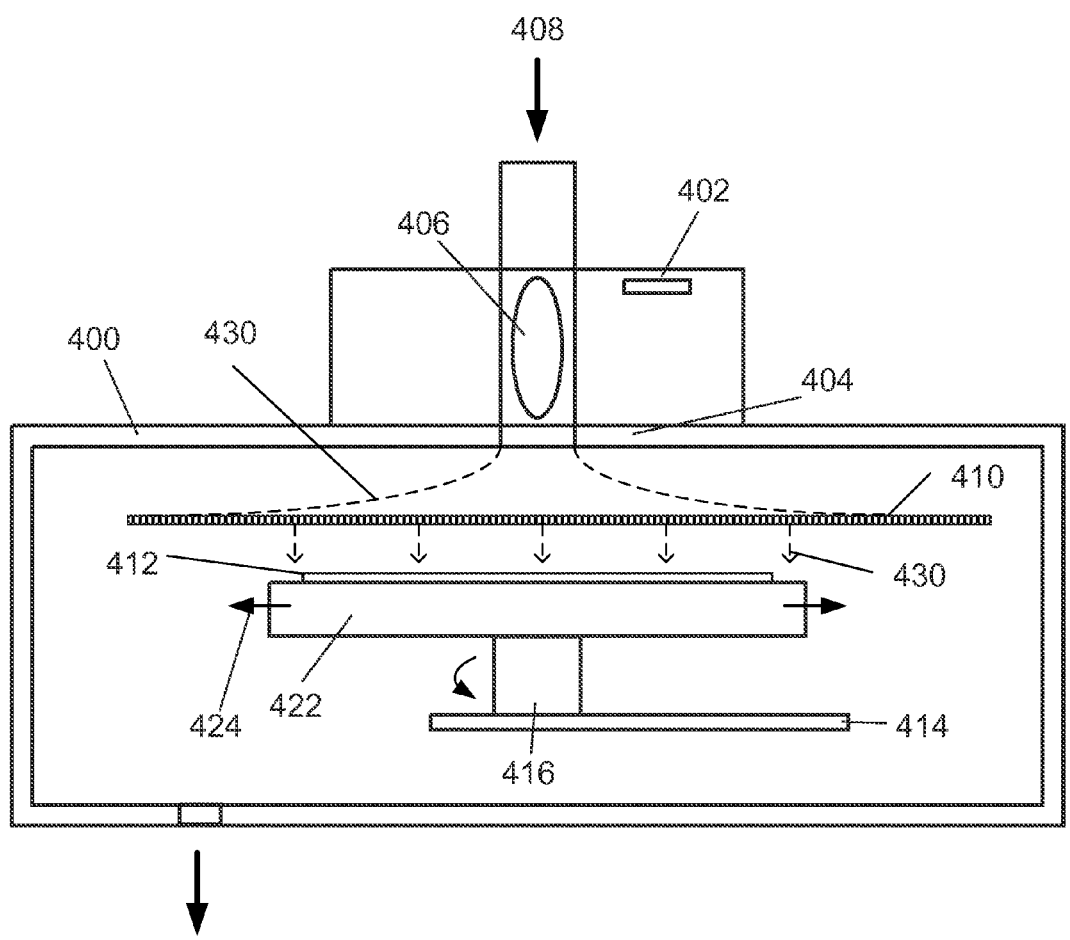
FIG. 4 is a simplified schematic diagram illustrating an exemplary processing chamber according to some embodiments.

FIG. 4 illustrates a generic layout of some embodiments of a system enabling combinatorial processing. A process chamber, 400, is provided. A plasma source (when employed), 402, is mounted on a chamber lid, 404, either directly as illustrated or through a short flange. The plasma, 406, is entrained into a central gas flow, 408, which is directed toward a showerhead, 410. The showerhead is disposed within the processing chamber between the remote plasma source and the substrate and is in close proximity to the substrate, 412. The showerhead further includes multiple process segments. In some embodiments, plasma is not employed and the showerhead is used for deposition using typical ALD or CVD processes within each process segment. The various process segments of the showerhead are operable to provide exposure of reactive species to respective regions of the substrate. A substrate positioning system, 414, can position the substrate, 412, directly under the showerhead, 410. As illustrated in FIG. 4, the substrate positioning system can provide an axis of rotation, 416. The rotation configuration illustrated can provide 360° of rotation. Alternatively, other positioning systems such as X-Y translators can also be used. In addition, substrate support, 422, may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

The substrate support, 422, can include a substrate heater (e.g., resistive or inductive) and can be sized to be larger than the largest substrate to be processed. Substrate temperatures for most applications are less than 700 C, although any suitable heater power and range of temperature control. The substrate support, 422, can also be configured to provide a gas purge flow, 424, for example from the edges of the support, using argon, helium, or any other gas that is not reactive under the process conditions. The substrate support, 422, can also be configured to provide a bias voltage to the substrate during processing.

Figure 5:
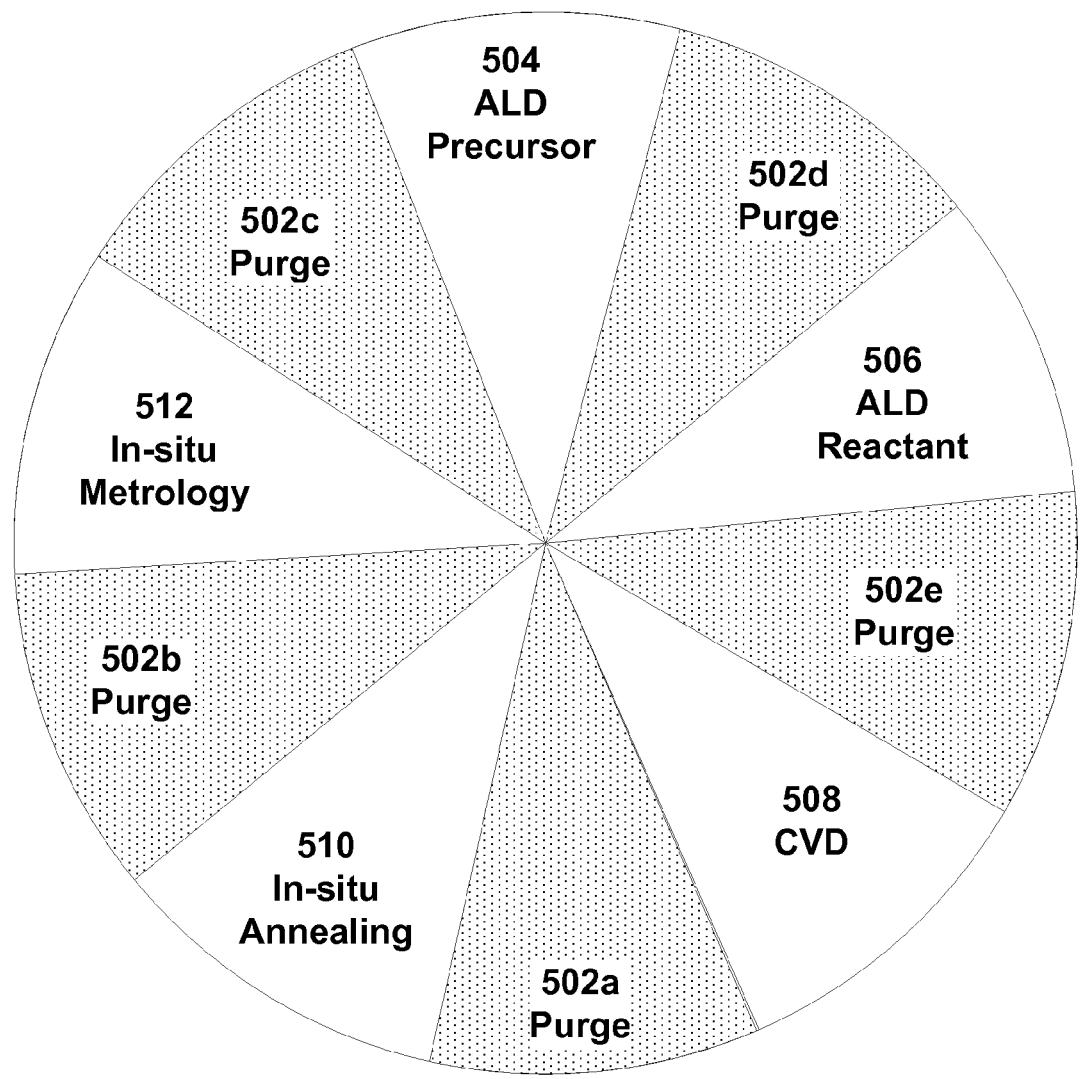
FIG. 5 is a simplified schematic diagram illustrating an exemplary segment configuration according to some embodiments.

FIG. 5 is a simplified schematic diagram illustrating an exemplary segment configuration according to some embodiments. FIG. 5 illustrates ten process segments, wherein five of the process segments are used for active processing and five process segments are used as purge zones to insure that there is no overlap between the active processing segments. The five active process segments are operable to perform at least a portion of a process sequence on a respective isolated region of the substrate. Therefore, using the configuration illustrated in FIG. 5, the substrate would include up to ten isolated regions, each region representing a segment of a circle having an angle of about 36 degrees. Those skilled in the art will understand that any practical number of process segments may be implemented. Although the process segments illustrated in FIG. 5 are represented as being of equal size, this is not a requirement. FIG. 5 is just one of many possible configurations and those skilled in the art will understand that the system may be configured to address desired processes or sequences. Examples of the functionality of each process segment include purge, exposure to an ALD precursor, exposure to an ALD reactant, CVD deposition, in-situ annealing, in-situ metrology, and plasma treatment. Further, plasma energy can be optionally added to the ALD precursor, ALD reactant, and CVD functionality. These will be discussed in further detail below.

In FIG. 5, five process segments, 502a-502e, have been configured as purge zones to insure that there is no overlap between the remaining five active processing segments. Typically, these segments include a flow of an inert gas (e.g. argon) or a non-reactive gas (e.g. nitrogen) to prevent species from neighboring process segments from interacting.

In FIG. 5, process segment 504 represents a process segment wherein an isolated region of the substrate can be exposed to an ALD precursor. Those skilled in the art will understand that this is a first step in a typical ALD deposition. The substrate would then be rotated to move the isolated region through process segment 502d and into process segment 506. Process segment 506 represents a process segment wherein the isolated region of the substrate can be exposed to an ALD reactant. Those skilled in the art will understand that this is a subsequent step in a typical ALD deposition. The substrate would then be rotated to move the isolated region back through process segment 502d and back to process segment 504, and this process would be repeated (e.g. substrate rotation in an oscillatory manner) until a layer of desired thickness is deposited. Note that the repeated rotation of the isolated region through process segment 502d corresponds to the purge steps typically employed in typical ALD processes between the exposure to the precursor and the exposure to the reactant. In some embodiments, plasma energy may be added to either one or both process segments 504 and 506 to provide energy to facilitate the ALD deposition (e.g. plasma enhanced ALD (PEALD)).

In FIG. 5, process segment 508 represents a process segment wherein an isolated region of the substrate can be exposed to a CVD process. Within this process segment, all precursors, reactants, and other gases required for the CVD process would be introduced. The substrate would remain stationary until a layer of desired thickness is deposited on an isolated region under this process segment. The two neighboring purge segments, 502a and 502e, would prevent the CVD gases from interacting with other process segments. In some embodiments, plasma energy may be added to process segment 508 to provide energy to facilitate the CVD deposition (e.g. plasma enhanced CVD (PEVCD)).

In FIG. 5, process segment 510 represents a process segment wherein an isolated region of the substrate can be exposed to an in-situ anneal treatment. Those skilled in the art will understand that process segment 510 would not be part of a showerhead or other gas distribution apparatus, but rather represents a region of the process chamber where a portion of the substrate can be exposed to the in-situ anneal treatment. This process segment may be used to anneal previously deposited layers to crystallize them, activate dopants, or to promote diffusion processes within the layers. The in-situ anneal process will require an isolated technique such as a laser anneal technique, a site-isolated rapid thermal process (RTP) anneal process, or a flash lamp anneal (FLA) process. Examples of site-isolated RTP processes are described in co-owned U.S. patent application Ser. No. 13/722,624, filed on Dec. 20, 2012, which is herein incorporated by reference for all purposes.

In FIG. 5, process segment 512 represents a process segment wherein an isolated region of the substrate can be positioned so that in-situ metrology can be used to measure a characteristic of the deposited layer. Those skilled in the art will understand that process segment 512 would not be part of a showerhead or other gas distribution apparatus, but rather represents a region of the process chamber where a portion of the substrate can be exposed to the in-situ metrology. Examples of characteristics that might be measured include thickness, refractive index, reflectivity, and composition, among others. Those skilled in the art will understand that there are several analytical techniques that could be adapted for in-situ characterization of the deposited films.

Figure 6:
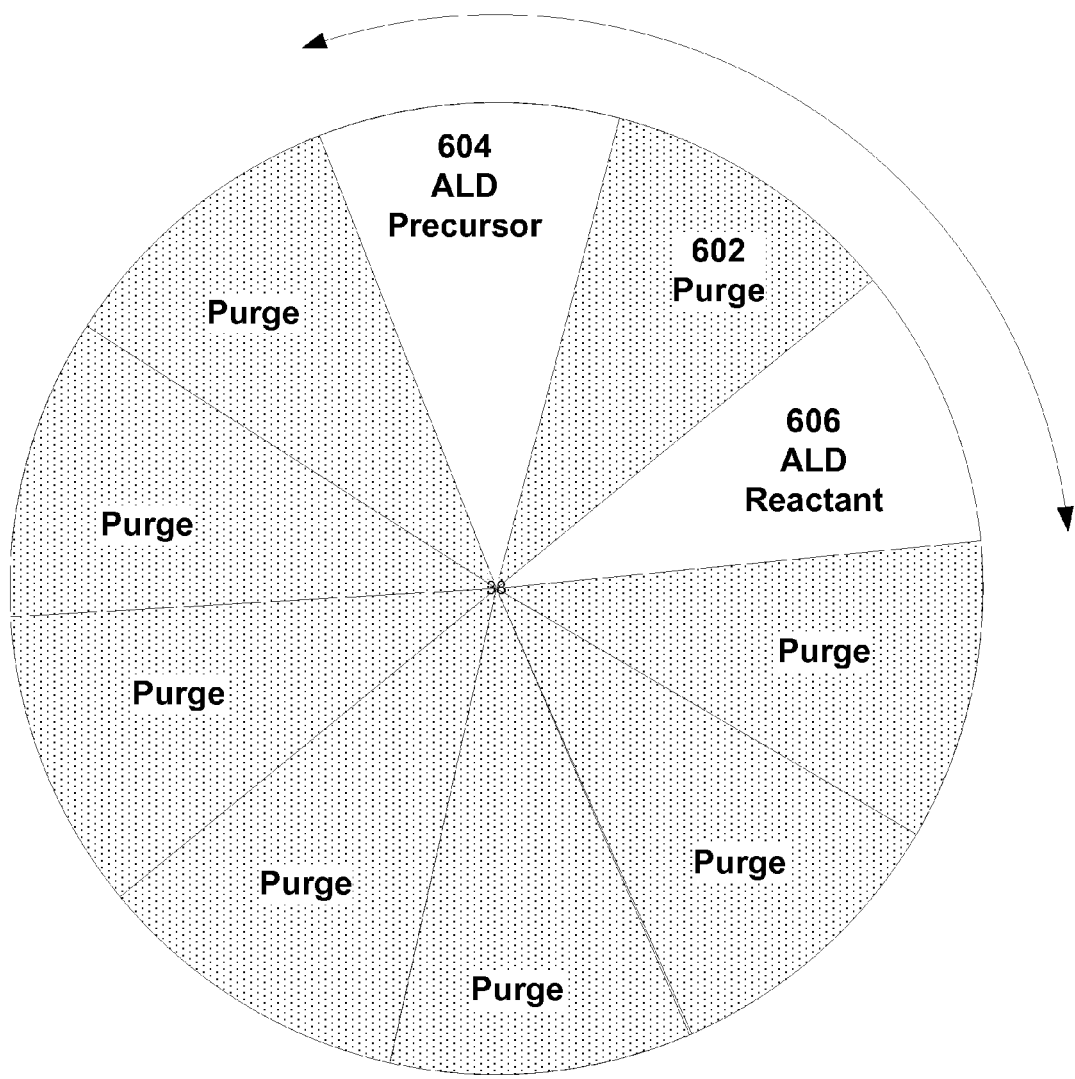
FIG. 6 is a simplified schematic diagram illustrating an exemplary segment configuration according to some embodiments.

FIG. 6 is a simplified schematic diagram illustrating an exemplary segment configuration according to some embodiments. FIG. 6 illustrates ten process segments, wherein two of the process segments are used for active processing and eight process segments are used as purge zones to insure that there is no overlap between the active processing segments. The two active process segments are operable to perform at least a portion of a process sequence on a respective isolated region of the substrate. Specifically, the configuration illustrated in FIG. 6 will be used to describe an ALD deposition process.

In FIG. 6, process segment 604 represents a process segment wherein an isolated region of the substrate can be exposed to an ALD precursor. Those skilled in the art will understand that this is a first step in a typical ALD deposition. The substrate would then be rotated through process segment 602 and into process segment 606. Process segment 606 represents a process segment wherein the isolated region of the substrate can be exposed to an ALD reactant. Those skilled in the art will understand that this is a subsequent step in a typical ALD deposition. The substrate would then be rotated back through process segment 602 and back to process segment 604, and this process would be repeated (e.g. substrate rotation in an oscillatory manner) until a layer of desired thickness is deposited. Note that the repeated rotation through process segment 602 corresponds to the purge steps typically employed in typical ALD processes between the exposure to the precursor and the exposure to the reactant. In some embodiments, plasma energy may be added to either one or both process segments 604 and 606 to provide energy to facilitate the ALD deposition (e.g. plasma enhanced ALD (PEALD)).

Figure 7:
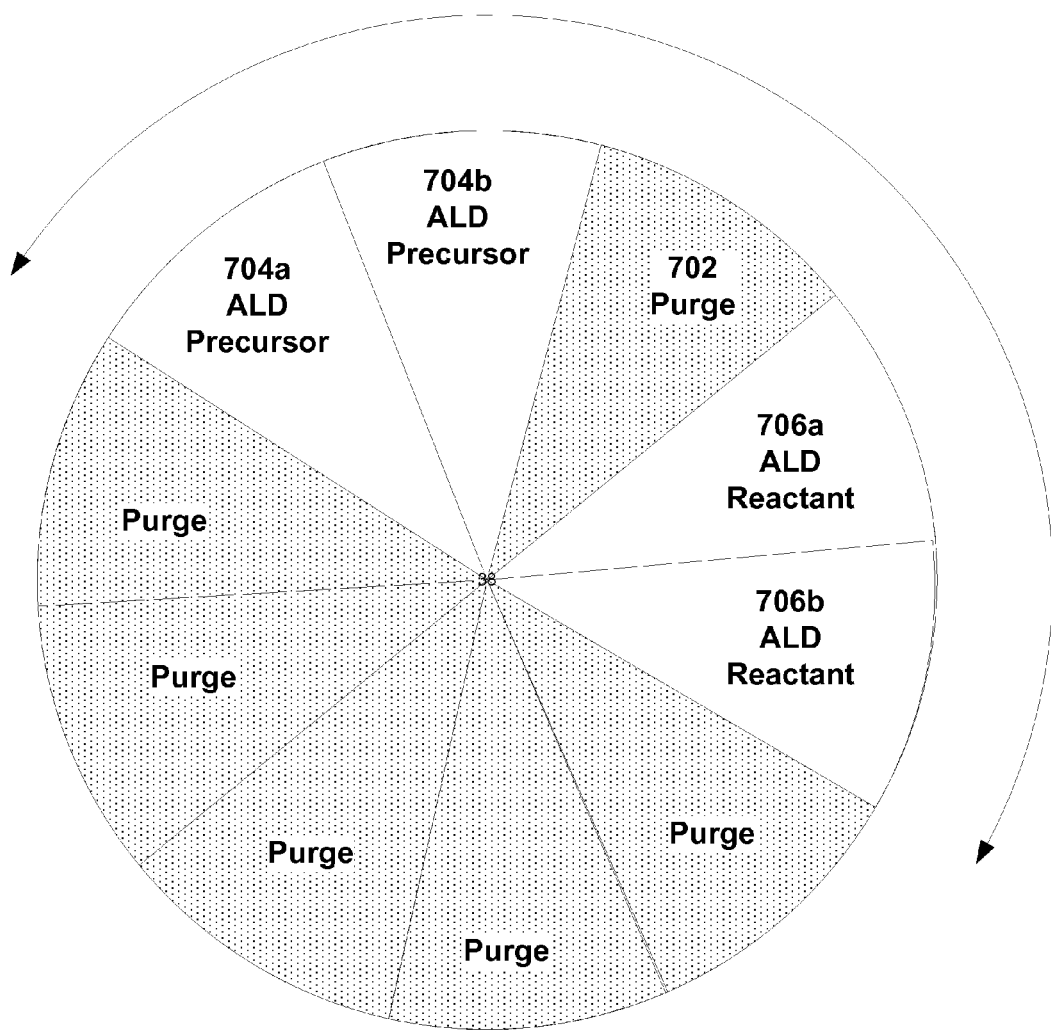
FIG. 7 is a simplified schematic diagram illustrating an exemplary segment configuration according to some embodiments.

FIG. 7 is a simplified schematic diagram illustrating an exemplary segment configuration according to some embodiments. FIG. 7 illustrates ten process segments, wherein four of the process segments are used for active processing and six process segments are used as purge zones to insure that there is no overlap between the active processing segments. The four active process segments are operable to perform at least a portion of a process sequence on a respective isolated region of the substrate. Specifically, the configuration illustrated in FIG. 7 will be used to describe an ALD deposition process.

In FIG. 7, process segments 704a and 704b represent process segments wherein an isolated region of the substrate can be exposed to an ALD precursor. Note that these two process segments are adjacent and allow a larger region of the substrate to receive the deposition as compared to the configuration illustrated in FIG. 6. This may be accomplished by simply replacing the purge gas in the adjacent process segment with the precursor gas. Those skilled in the art will understand that this is a first step in a typical ALD deposition. The substrate would then be rotated through process segment 702 and into process segments 706a and 706b. Process segments 706a and 706b represents process segments wherein the isolated region of the substrate can be exposed to an ALD reactant. Note that these two process segments are adjacent and allow a larger region of the substrate to receive the deposition as compared to the configuration illustrated in FIG. 6. This may be accomplished by simply replacing the purge gas in the adjacent process segment with the reactant gas. Those skilled in the art will understand that this is a subsequent step in a typical ALD deposition. The substrate would then be rotated back through process segment 702 and back to process segments 704a and 704b, and this process would be repeated (e.g. substrate rotation in an oscillatory manner) until a layer of desired thickness is deposited. Note that the repeated rotation through process segment 702 corresponds to the purge steps typically employed in typical ALD processes between the exposure to the precursor and the exposure to the reactant. In some embodiments, plasma energy may be added to either one or all process segments (704a, 704b) and (706a, 706b) to provide energy to facilitate the ALD deposition (e.g. plasma enhanced ALD (PEALD)).

Figure 8:
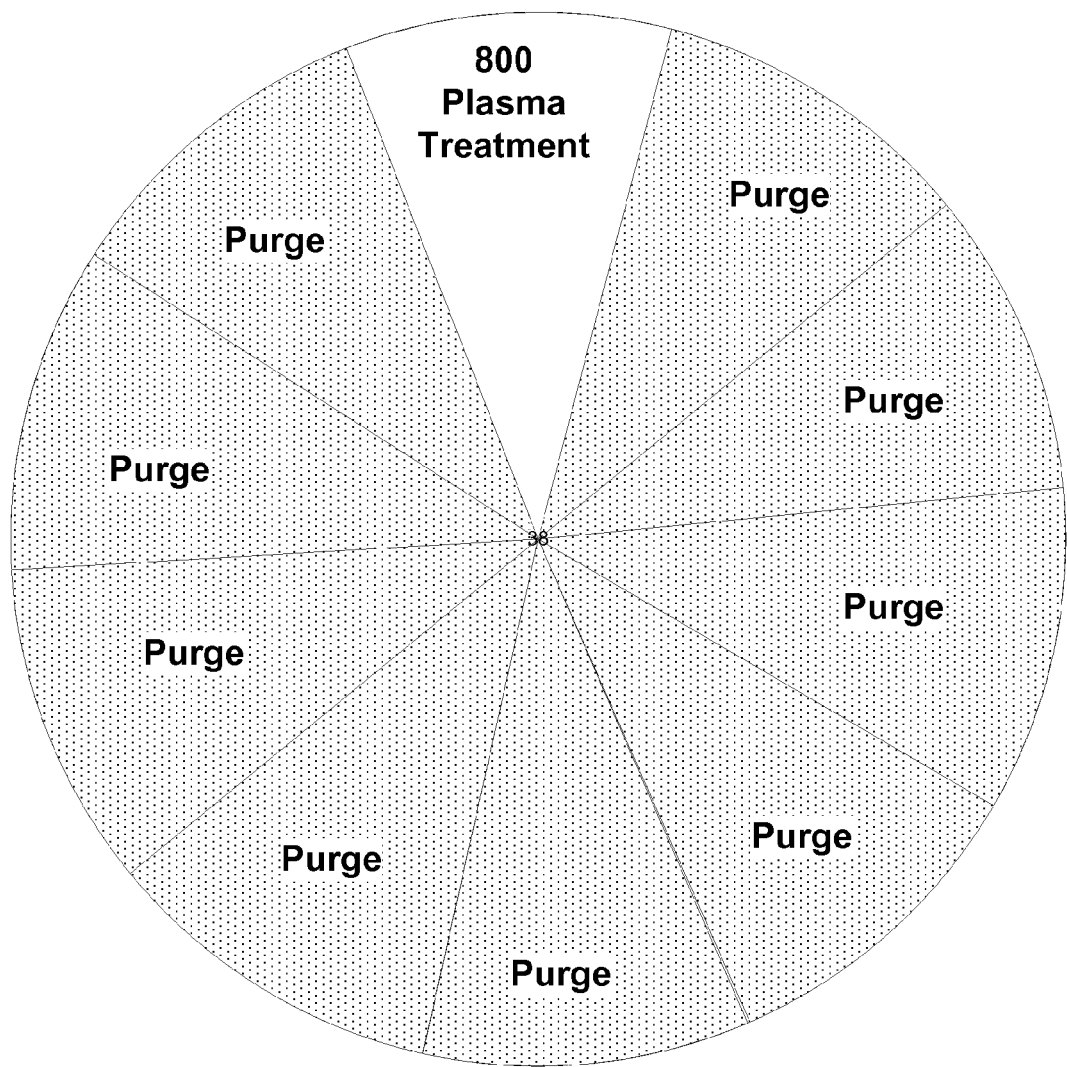
FIG. 8 is a simplified schematic diagram illustrating an exemplary segment configuration according to some embodiments.

FIG. 8 is a simplified schematic diagram illustrating an exemplary segment configuration according to some embodiments. FIG. 8 illustrates ten process segments, wherein one of the process segments is used for active processing and nine process segments are used as purge zones to insure that there is no overlap between the active processing segments. The active process segment is operable to perform at least a portion of a process sequence on a respective isolated region of the substrate. Specifically, the configuration illustrated in FIG. 8 will be used to describe a plasma treatment process.

In FIG. 8, process segment 800 represents a process segment wherein an isolated region of the substrate can be exposed to a plasma treatment. Plasma treatments may be used in several applications. It may be advantageous to clean the surface of the substrate prior to deposition. Plasma activated species are effective at removing contaminants (e.g. carbon, oxide films, etc.) at relatively low temperatures. Examples of gases that may be used in the cleaning include ammonia, hydrogen, oxygen, and ozone, among others. Plasma activated species are effective at treating the surface of deposited layers. These treatments may be effective to alter characteristics of the deposited layer. Examples of characteristics that may be altered include the layer density, surface roughness, and degree of crystallinity, among others. Examples of gases that may be used in the cleaning include ammonia, argon, hydrogen, nitrogen, oxygen, and ozone, among others.

Figure 9:
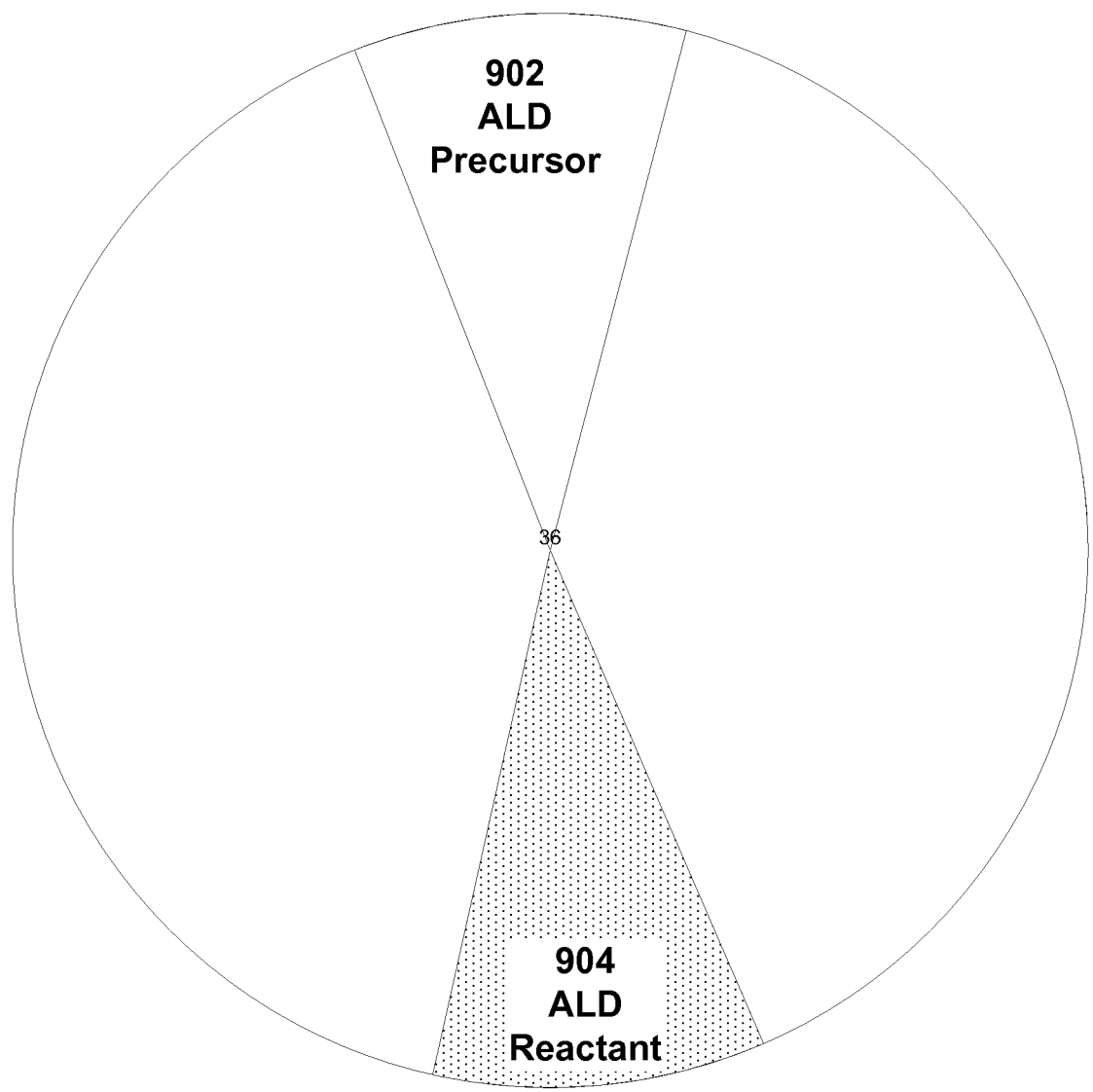
FIG. 9 is a simplified schematic diagram illustrating an exemplary segment configuration according to some embodiments.

FIG. 9 is a simplified schematic diagram illustrating an exemplary segment configuration according to some embodiments. FIG. 9 illustrates two process segments, wherein each of the process segments is used for active processing. The remaining portions of the showerhead or chamber lid may include purge segments. The active process segments are operable to perform at least a portion of a process sequence on a respective region of the substrate. The configuration illustrated in FIG. 9 is operable to allow a process to be applied to an arbitrary angle of the substrate. An ALD process will be used as an example, but any of the processes discussed previously can also be applied to this configuration.

As indicated in FIG. 9, process gas segment 902 can be used to supply an ALD precursor to the surface of the substrate. After initiating the flow of the ALD precursor, the substrate can be rotated through an angle, θ, to expose that portion of the surface to the ALD precursor. This allows the angle to be varied from the angle of the process gas segment 902 (e.g. the smallest region that can be exposed) up to the full wafer. Gas segments 902 and 904 are illustrated as being on opposite sides of the chamber. However, those skilled in the art will understand that the two segments can be placed in any useful configuration.

As indicated in FIG. 9, process gas segment 904 can be used to supply an ALD reactant to the surface of the substrate after the surface has been exposed to the ALD precursor. After initiating the flow of the ALD reactant, the substrate can be rotated through an angle, 8, to expose that portion of the surface to the ALD reactant. This allows the angle to be varied from the angle of the process gas segment 904 (e.g. the smallest region that can be exposed) up to the full wafer. Typically, this angle is the same angle used for the exposure of the ALD precursor.

FIG. 9 also illustrates a configuration that can be used for full wafer processing. An ALD process will be used as an example, but any of the processes discussed previously can also be applied to this configuration. As indicated in FIG. 9, process gas segment 902 can be used to supply an ALD precursor to the surface of the substrate. All remaining process segments would have a purge flow that is just enough to prevent the ALD precursor from back streaming into the respective process segment. The ALD precursor from process segment 902 will fill the entire process chamber and cover the entire surface of the substrate. The substrate may be rotated or may remain stationary during the exposure. After a certain time, the ALD precursor is purged from the process chamber.

As indicated in FIG. 9, process gas segment 904 can be used to supply an ALD reactant to the surface of the substrate. All remaining process segments would have a purge flow that is just enough to prevent the ALD reactant from back streaming into the respective process segment. The ALD reactant from process segment 904 will fill the entire process chamber and cover the entire surface of the substrate. The substrate may be rotated or may remain stationary during the exposure. After a certain time, the ALD reactant is purged from the process chamber.

Figure 10:
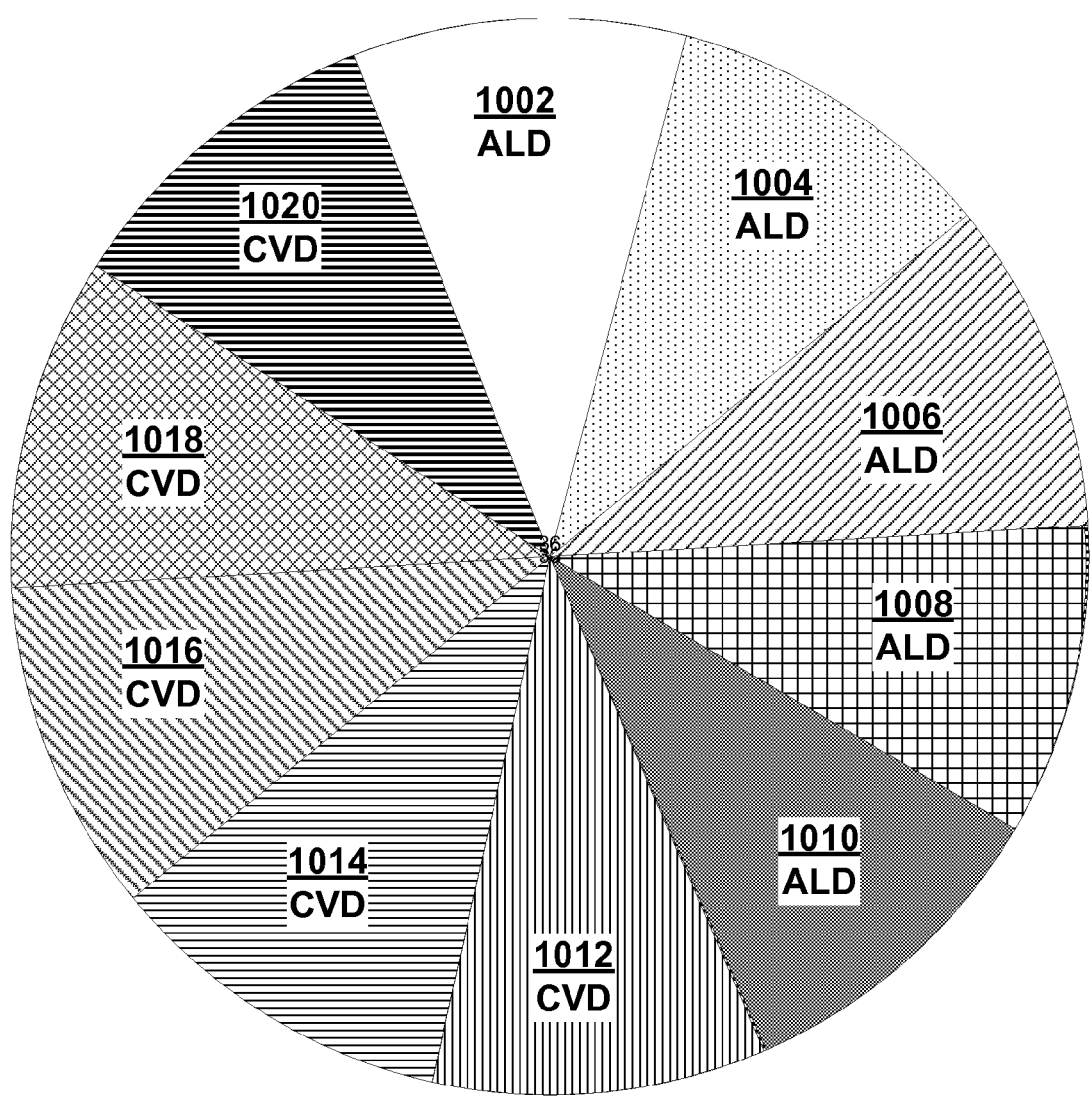
FIG. 10 is a simplified schematic diagram illustrating the resulting isolated regions on a substrate according to some embodiments.

FIG. 10 is a simplified schematic diagram illustrating the resulting isolated regions on a substrate according to some embodiments. FIG. 10 illustrates ten isolated regions, wherein each of the isolated regions has received a different layer deposition. FIG. 10 illustrates that five of the regions have received layers using an ALD technique and five of the regions have received layers using a CVD technique. The different shading among the ten isolated regions is intended to convey that each isolated region received a different layer. The layers may be different due to process parameters such as process material amounts, reactant species, processing temperatures, processing times, processing pressures, processing flow rates, processing powers, processing reagent compositions, the rates at which the reactions are quenched, deposition order of process materials, and process sequence steps. These process parameters may be varied in a combinatorial manner as discussed previously. Those skilled in the art will understand that the illustration of five ALD deposited regions and five CVD deposited regions is arbitrary and only used as an example. Any configuration of regions can be designed without undue experimentation.

Figure 11:
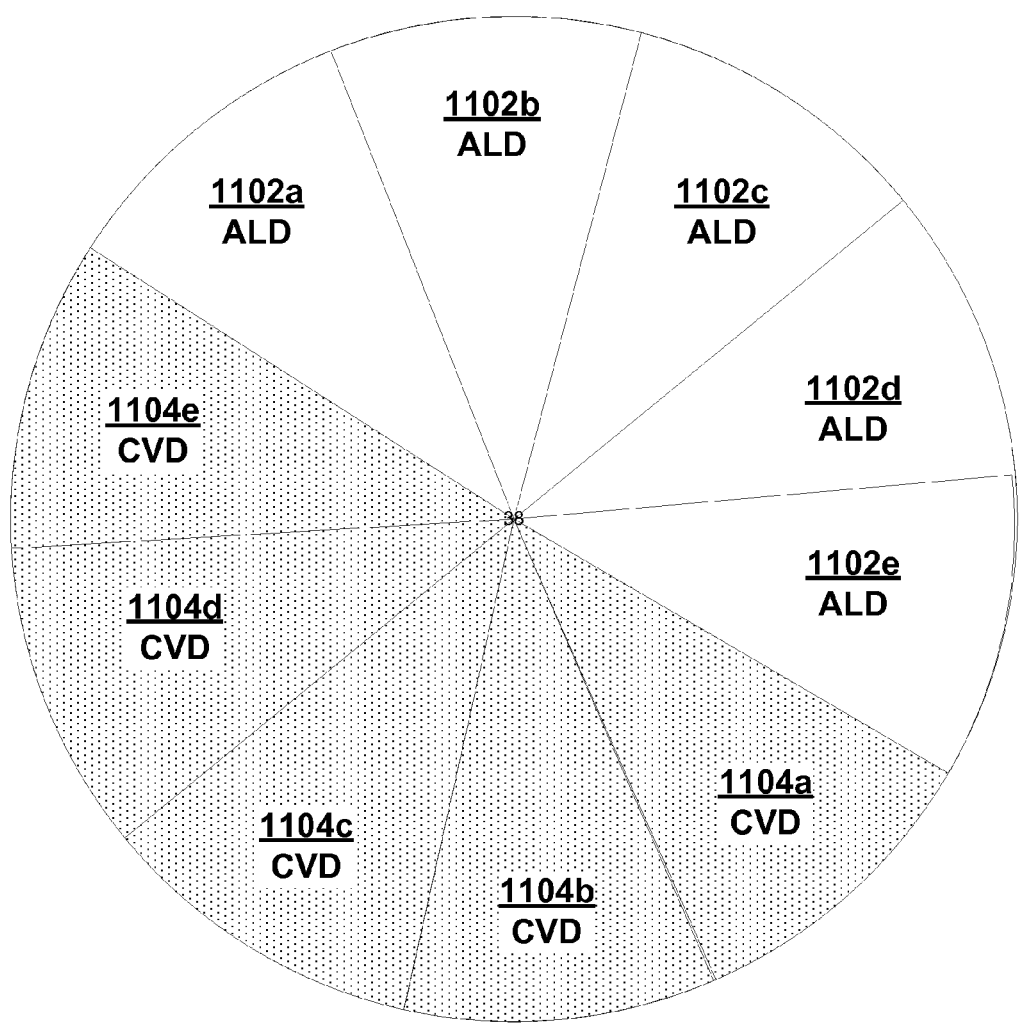
FIG. 11 is a simplified schematic diagram illustrating the resulting isolated regions on a substrate according to some embodiments.

FIG. 11 is a simplified schematic diagram illustrating the resulting isolated regions on a substrate according to some embodiments. FIG. 11 illustrates ten isolated regions. FIG. 11 illustrates that five of the regions have received layers using an ALD technique and five of the regions have received layers using a CVD technique. This configuration of isolated regions allows half of the wafer to receive a layer using an ALD technique and half of the wafer to receive a layer using a CVD technique. This substrate may be used in subsequent experiments where additional layers are deposited on each half using HPC techniques as discussed previously. Those skilled in the art will understand that the illustration of five ALD deposited regions and five CVD deposited regions is arbitrary and only used as an example. Any configuration of regions can be designed without undue experimentation.

Figure 12:
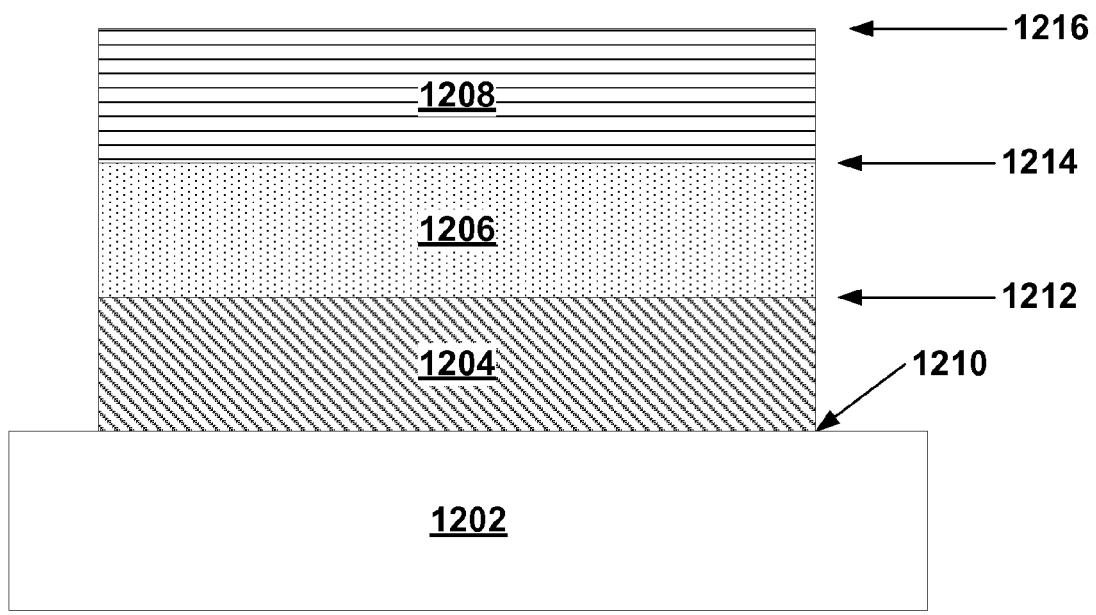
FIG. 12 is a simplified schematic diagram illustrating a cross section of a film stack formed on a substrate according to some embodiments.

FIG. 12 is a simplified schematic diagram illustrating a cross section of a film stack formed on a substrate according to some embodiments. FIG. 12 is meant to illustrate a cross section through a film stack formed within a single isolated region on the substrate. As illustrated in FIG. 12, a first layer, 1204, is deposited on an isolated region of substrate, 1202. The first layer may be deposited using any one of an ALD, PEALD, CVD, or PECVD technique as discussed previously. A second layer, 1206, is deposited above the first layer. The second layer may be deposited using any one of an ALD, PEALD, CVD, or PECVD technique as discussed previously. The deposition technique for the second layer may be the same or different from that used to deposit the first layer. A third layer, 1208, is deposited above the second layer. The third layer may be deposited using any one of an ALD, PEALD, CVD, or PECVD technique as discussed previously. The deposition technique for the third layer may be the same or different from that used to deposit either of the first layer or the second layer.

As discussed previously, a plasma treatment and/or cleaning process, 1210, may be optionally applied to the surface of the substrate before the deposition of the first layer. As discussed previously, a plasma treatment process, 1212, may be optionally applied to the surface of the first layer before the deposition of the second layer. As discussed previously, a plasma treatment process, 1214, may be optionally applied to the surface of the second layer before the deposition of the third layer. As discussed previously, a plasma treatment process, 1216, may be optionally applied to the surface of the third layer after the deposition of the third layer.

FIG. 13 illustrates an exemplary table for options during the processing of a substrate according to some embodiments. The table in FIG. 13 indicates that one of seven possible processes or actions can be selected at each step of the overall process sequence. Generally, a process sequence can include between 1 and "N" steps. As an example, the simple film stack in FIG. 12 would involve three steps to deposit the three layers. Therefore, in Step #1, the first layer, 1204, would be deposited using one of an ALD, PEALD, CVD, or PECVD technique. In Step #2, the second layer, 1206, would be deposited using one of an ALD, PEALD, CVD, or PECVD technique. In Step #3, the third layer, 1208, would be deposited using one of an ALD, PEALD, CVD, or PECVD technique.

As a second example, the simple film stack in FIG. 12 wherein all four of the optional plasma treatment processes were also selected would involve seven steps to deposit the three layers and implement the four plasma treatment processes. Therefore, in Step #1, a plasma treatment, 1210, would be applied to the surface of the substrate. In Step #2, the first layer, 1204, would be deposited using one of an ALD, PEALD, CVD, or PECVD technique. In Step #3, a plasma treatment, 1212, would be applied to the surface of the first layer. In Step #4, the second layer, 1206, would be deposited using one of an ALD, PEALD, CVD, or PECVD technique. In Step #5, a plasma treatment, 1214, would be applied to the surface of the second layer. In Step #6, the third layer, 1208, would be deposited using one of an ALD, PEALD, CVD, or PECVD technique. In Step #7, a plasma treatment, 1216, would be applied to the surface of the third layer. Those skilled in the art will understand that additional processes such an in-situ annealing and in-situ metrology may be applied as discussed previously. Those skilled in the art will understand that there are many possible methods to combine the seven processes listed in FIG. 13 within a general process sequence of "N" steps.

The invention has been described in relation to particular examples, which are intended in all respects to be illustrative rather than restrictive. Various aspects and/or components of the described embodiments may be used singly or in any combination. It is intended that the specification and examples be considered as exemplary only, with a true scope and spirit of the invention being indicated by the claims.

What is claimed is:

1. A method comprising:
   providing a process chamber, wherein the process chamber comprises a showerhead, and wherein the showerhead comprises a plurality of process segments;
   positioning a substrate beneath the showerhead within the process chamber;
   performing a first process on a first isolated region of the substrate through a first of the plurality of process segments;

rotating the substrate to position the first isolated region beneath a second of the plurality of process segments;
performing a second process on the first isolated region of the substrate through the second of the plurality of process segments; and
performing a third process on a second isolated region of the substrate beneath a third of the plurality of process segments,
wherein each of the first process and the second process comprises at least one of exposure to an atomic layer deposition (ALD) precursor, exposure to an ALD reactant, exposure to a purge gas, or chemical vapor deposition (CVD) deposition, and wherein the third process comprises at least one of in-situ annealing and in-situ metrology.

2. The method of claim 1 wherein the first process comprises exposure to an ALD precursor, and the second process comprises exposure to an ALD reactant.

3. The method of claim 1 wherein the first process comprises at least one of exposure to an ALD precursor and exposure to an ALD reactant, and the second process comprises CVD deposition.

4. The method of claims 1 wherein the exposure to an ALD precursor, the exposure to an ALD reactant, or the CVD deposition further comprises exposure to plasma energy.

5. The method of claim 1 wherein the performing of the first process comprises a deposition of a first layer.

6. The method of claim 5 further comprising applying a first plasma treatment process to a surface of the substrate before the deposition of the first layer.

7. The method of claim 6 wherein the applying the first plasma treatment comprises rotating the substrate to position the first isolated region beneath a a fourth of the plurality of process segments.

8. The method of claim 5 wherein the performing the second process comprises a deposition of a second layer.

9. The method of claim 8 further comprising applying a second plasma treatment process to a surface of the first layer before the deposition of the second layer.

10. The method of claim 9 wherein the applying of the second plasma treatment comprises rotating the substrate to position the first isolated region beneath the fourth of the plurality of process segments.

11. The method of claim 9 further comprising:
rotating the substrate to position the first isolated region beneath a fifth of the plurality of process segments; and
performing a fourth process on the first isolated region of the substrate through the fifth of the plurality of process segments.

12. The method of claim 11 wherein the performing the fourth process comprises a deposition of a third layer.

13. The method of claim 12 further comprising applying a third plasma treatment process to a surface of the second layer before the deposition of the third layer.

14. A method comprising:
providing a process chamber, wherein the process chamber comprises a showerhead, and wherein the showerhead comprises a plurality of process segments;
positioning a substrate beneath the showerhead;
performing a first process on a first isolated region of the substrate through a first of the plurality of process segments;
rotating the substrate to position the first isolated region beneath a second of the plurality of process segments;
performing a second process on the first isolated region of the substrate through the second of the plurality of process segments;
rotating the substrate to position the first isolated region beneath a third of the plurality of process segments; and
performing a third process on the first isolated region of the substrate through the third of the plurality of process segments,
wherein each of the first process and the second process comprises at least one of exposure to an ALD precursor, exposure to an ALD reactant, exposure to a purge gas, and CVD deposition, and the third process comprises at least one of in-situ annealing and in-situ metrology, and the first process, the second process, and the third process are performed while the substrate is within the process chamber.

15. The method of claim 14, wherein the first process comprises at least one of exposure to an ALD precursor and exposure to an ALD reactant, and wherein the second process comprises CVD deposition.

16. The method of claim 14, wherein the first process comprises exposure to an ALD precursor, and the second process comprises exposure to an ALD reactant.

17. A method comprising:
providing a process chamber, wherein the process chamber comprises a showerhead, and wherein the showerhead comprises a plurality of process segments;
positioning a substrate beneath the showerhead;
exposing a first isolated region of the substrate to an ALD precursor through a first of the plurality of process segments;
rotating the substrate to position the first isolated region beneath a second of the plurality of process segments;
exposing the first isolated region of the substrate to an ALD reactant through the second of the plurality of process segments;
rotating the substrate to position the first isolated region beneath a third of the plurality of process segments; and
performing a CVD deposition process on the first isolated region of the substrate through the third of the plurality of process segments,
wherein the exposing of the first isolated region to the ALD precursor, the exposing of the first isolated region to the ALD reactant, and the performing of the CVD deposition process on the first isolated region are performed while the substrate is within the process chamber.

18. The method of claim 17, further comprising:
rotating the substrate to position the first isolated region beneath a fourth of the plurality of process segments; and
performing at least one of an in-situ annealing process and an in-situ metrology process on the first isolated region while the first isolated region is beneath the fourth of the plurality of segments.

* * * * *